(12) United States Patent
Dür

(10) Patent No.: US 11,404,304 B2
(45) Date of Patent: Aug. 2, 2022

(54) PIN LIFTING DEVICE WITH SLIDING GUIDE

(71) Applicant: VAT Holding AG, Haag (CH)

(72) Inventor: Michael Dür, Hohenweiler (AT)

(73) Assignee: VAT HOLDING AG, Haag (CH)

( * ) Notice: Subject to any disclaimer, the term of this patent is extended or adjusted under 35 U.S.C. 154(b) by 45 days.

(21) Appl. No.: 17/002,494

(22) Filed: Aug. 25, 2020

(65) Prior Publication Data
US 2021/0066115 A1    Mar. 4, 2021

(30) Foreign Application Priority Data

Aug. 28, 2019   (DE) .................... 10 2019 006 050.4

(51) Int. Cl.
   *H01L 21/687*     (2006.01)
   *B25J 9/00*       (2006.01)

(52) U.S. Cl.
   CPC ....... *H01L 21/68742* (2013.01); *B25J 9/0096* (2013.01)

(58) Field of Classification Search
   CPC .............. B25J 9/0096; H01L 21/68742; H01L 21/67739; H01L 21/68735; H01L 21/6875; H01L 21/67259; H01L 21/68792; F15B 11/123; F15B 11/06
   See application file for complete search history.

(56) References Cited

U.S. PATENT DOCUMENTS

| 6,481,723 | B1 | 11/2002 | Hao et al. |
| 6,646,857 | B2 | 11/2003 | Anderson et al. |
| 2020/0075390 | A1* | 3/2020 | Dur .................. H01L 21/68742 |

FOREIGN PATENT DOCUMENTS

| DE | 10 2018 007 307 A1 | 3/2020 |
| KR | 20180001495 A | * 1/2018 |

OTHER PUBLICATIONS

DE102018007307A1—Pen lifter—Google Patents (Machine English Translation).

* cited by examiner

*Primary Examiner* — Peter B Kim
(74) *Attorney, Agent, or Firm* — Muncy, Geissler, Olds & Lowe, P.C.

(57) ABSTRACT

Disclosed is a pin lifting device for moving and positioning a substrate in a process atmosphere region. The pin lifting device has a coupling part including a coupling configured to receive a support pin designed to contact and carry the substrate, and a drive unit configured to adjust the coupling linearly along an adjustment axis (A) from a lowered normal position into an extended support position and back. The coupling part has a sliding guide element movable along the adjustment axis (A), where the sliding guide element is coupled to the drive unit and where the sliding guide element has at least one sliding element. The sliding element interacts with a guide surface provided by the coupling part to guide the sliding guide element can be linearly along the adjustment axis (A) and in a sliding manner relative to the guide surface.

13 Claims, 3 Drawing Sheets

PIN LIFTING DEVICE WITH SLIDING GUIDE

Figure 1:
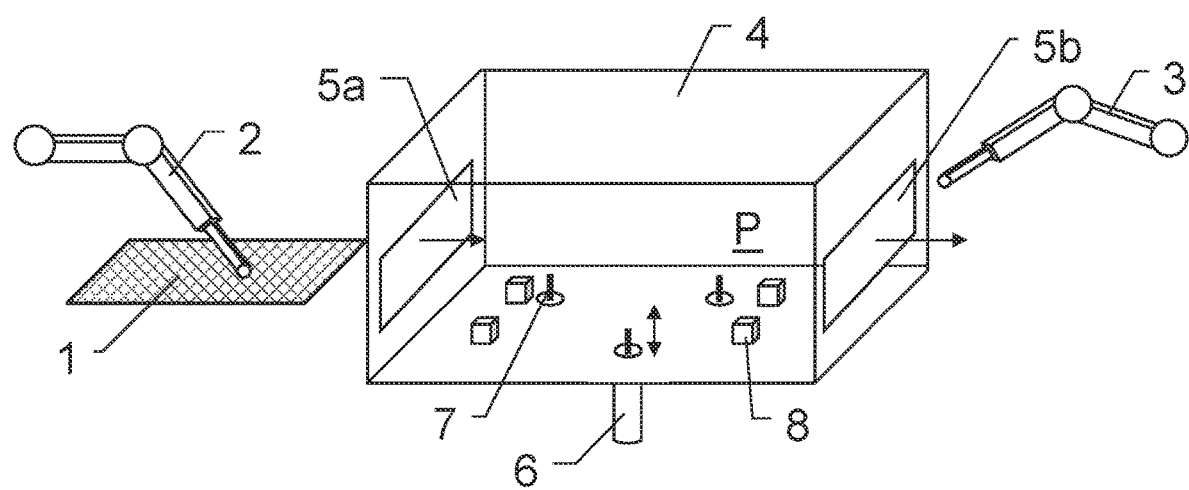

The present application claims priority to German Patent application 10 2019 006 050.4 filed Aug. 28, 2019, which is herein incorporated by reference in its entirety.

The invention relates to a pin lifting device for moving and positioning a substrate in a process chamber.

Pin lifting devices, also known as pin lifters, are typically designed and provided for the reception and defined positioning of a substrate to be processed in a process chamber. These are used in particular for vacuum chamber systems in the area of IC, semiconductor, flat panel or substrate production, which must take place in a protected atmosphere without the presence of contaminating particles.

Such vacuum chamber systems comprise in particular at least one evacuatable vacuum chamber which is provided for receiving semiconductor elements or substrates to be processed or produced and which has at least one vacuum chamber opening, through which the semiconductor elements or other substrates can be guided into and out of the vacuum chamber. For example, in a production plant for semiconductor wafers or liquid crystal substrates, the highly sensitive semiconductor or liquid crystal elements pass sequentially through several process vacuum chambers in which the parts located within the process vacuum chambers are each processed by means of a processing device.

Such process chambers often have at least one transfer valve whose cross-section is adapted to the substrate and the robot and through which the substrate can be introduced into the vacuum chamber and, optionally, removed after the intended processing. Alternatively, a second transfer valve may be provided through which the processed substrate is removed from the chamber.

The substrate, e.g. a wafer, is guided, for example, by a suitably designed and controlled robot arm, which can be guided through the opening in the process chamber provided by the transfer valve. The process chamber is then loaded by gripping the substrate with the robot arm, introducing the substrate into the process chamber and depositing the substrate in the chamber in a defined manner. The process chamber is emptied accordingly.

For the placement of the substrate and for the exact positioning of the substrate in the chamber, a relatively high accuracy and mobility of the substrate must be ensured. For this purpose, pin lifting systems are used which provide a plurality of support points for the substrate and thus a load distribution (due to the dead weight of the substrate) over the entire substrate.

For example, the substrate is brought into position by the robot via the support pins of the lifting device and lifted by the pins. Alternatively, the pins are in a receiving position and the robot places the substrate on the pins in this position. The substrate is deposited by lowering the pins onto a carrier, e.g. a potential plate (chuck), and the robot arm, which typically carries the substrate, is moved out of the chamber, e.g. simultaneously with or after the substrate is deposited or lowered. The pins can be lowered further after the substrate has been deposited and are then separated from it, i.e. there is no contact between the pins and the substrate. After removing the robot arm and closing (and introducing process gas or evacuating) the chamber, the processing step is carried out.

A low force effect on the substrate is particularly important after the process step has been carried out in the chamber and when the substrate is subsequently raised, as the substrate can adhere to the carrier, for example. If the substrate is pushed away from the carrier too quickly, the substrate may break, as the adhesive forces cannot be overcome or resolved at least at certain contact points. In addition, even if contact is established between the support pins and the substrate, any impact with the substrate can lead to undesired stress (or breakage).

At the same time, in addition to the gentlest possible and careful treatment of the substrates to be processed, the shortest possible processing time should also be made possible. This means that the substrate can be brought into the defined conditions—loading and unloading position and processing position—in the chamber as quickly as possible.

To avoid unwanted shocks during the processing of semiconductor wafers, for example, U.S. Pat. No. 6,481,723 B1 recommends the use of a special stop device instead of hard motion stops in a pin lifter. Any hard plastic stops should be replaced here by a combination of a softer designed stop part and a hard stop, wherein the contact with the soft stop part is first made for the limitation of movement and then the hard stop is brought into contact with the soft stop part and damped accordingly.

The U.S. Pat. No. 6,646,857 B2 proposes a regulation of the lifting movement by means of a recorded occurring force. Here, the support pins can be moved depending on the force signal received, so that the lifting force on the support pins always acts on the wafer in a dosed and controlled manner.

With each machining cycle, the support pins are brought into contact with the substrate to be received and released from it. This naturally results in corresponding mechanical stresses on the pins and the drive. The machining cycles are often timed in a comparatively tight manner and require a relatively short process time. A large number of repetitions in a comparatively short time can be the result of this process implementation. Typically, the support pins are therefore regarded as wear material and require regular replacement, i.e. they usually have to be replaced after a certain number of cycles or a certain operating time.

Accordingly, a motor of a mechatronically designed pin lifter, i.e. a pin lifter with an electric motor for adjusting the pin, is subjected to increased stress and requires precise control for contacting the substrate.

Naturally, a part of such a pin lifting device is connected to a process volume (process chamber), e.g. the pin lifting device is flanged to the process chamber. Typically, such a connection influences the various conditions of the chamber (e.g. temperature, potential) according to the condition of the pin lifting device and vice versa. Any potential difference can cause errors in the vacuum processing (e.g. etching).

It is therefore the object of the present invention to provide an improved pin lifting device, in which the above disadvantages are reduced or avoided.

In particular, it is the object of the invention to provide an improved pin lifting device which enables an optimized, i.e. in particular more precise and reliable, movement of individual support pins with low maintenance requirements.

It is a further special object of the invention to provide a pin lifting device which avoids the creation of a potential difference.

These objects are solved by the realization of the characteristic features of independent claims. Features which further develop the invention in an alternative or advantageous way can be found in the dependent claims.

The invention relates to a pin lifting device, in particular pin lifter, which is designed for moving and positioning a substrate, in particular a wafer to be processed (e.g. semiconductor wafer) or a ring, in a process atmosphere region which can be provided by a vacuum process chamber. The pin lifting device has a coupling part which has a coupling designed to receive a support pin designed to contact and support the substrate. In addition, a drive unit is provided which is designed and interacts with the coupling in such a way that the coupling can be moved linearly along an adjustment axis, namely from a lowered normal position, in particular for providing a support pin received by the coupling in an effect (e.g. moving, supporting and positioning a workpiece or substrate) in a state substantially free of effect (no contact with the substrate), into an extended supporting position, in particular for providing the intended effect of picking up and/or providing the substrate by the support pin, and back.

The intended effect of the support pin is essentially to pick up, contact, move, support and/or position etc. a workpiece or substrate. In this context, a non-effective state of the support pin is understood as a state in which the pin is contactless (not yet or no longer in contact) with a substrate to be contacted as intended and in particular temporarily fails to provide the intended purpose, e.g. is in a lowered waiting position. This is particularly the case while a machining process is being carried out on the substrate. However, the provision of the intended effect does not exclusively mean that there is contact between the support pin and the substrate, but rather that the pin can be in this state in an extended position and can be kept ready to receive a wafer (placing the wafer on the pin). In addition, the processes or movements that take place in case of contact (transport of the wafer) are to be understood as the provision of the intended effect.

An unloaded pick-up state represents a state in which a support pin to be received by the coupling is not in a retained target position relative to the coupling (in the coupling). The loaded state is to be understood as a state in which the support pin is held by the coupling in a received target position.

The coupling part has a sliding guide element movable along the adjustment axis, wherein the sliding guide element is coupled to the drive unit and to the coupling (in each case at least indirectly) and provides the interaction of the drive unit with the coupling. The sliding guide element has at least one sliding element, wherein the sliding element cooperates with a guide surface provided by the coupling part in such a way that the sliding guide element can be guided linearly along the adjustment axis and in a sliding manner relative to the guide surface.

The sliding guide element offers the advantage that direct coupling between the drive and the coupling can be avoided. This can provide an electrical separation between these components. In addition, the sliding guide element can provide precise, low-friction movement of the internal moving components of the pin lifter. Due to its sliding properties, this movement can be provided without lubricant and thus with low maintenance. The interaction of the sliding guide element with the guide surface also prevents the drive train from tilting, which in turn allows precise and jerk-free movement.

The invention is not limited to pin lifting devices for transporting wafers. Rather, the substrate to be moved also includes alternative parts or workpieces. In particular, a substrate is to be understood as a ring which is to be placed around a wafer to be processed. This ring is also placed on the chuck. The ring is preferably moved by an arrangement of pin lifting devices.

The inner diameter of the ring is equal to or slightly larger than the diameter of the wafer. The ring is used for virtual enlargement of the wafer area. This allows for precise processing of the entire wafer while simultaneously shielding the chuck. The ring thus forms a marginal area for processing, although reduced processing quality can be expected in this area anyway.

The pin lifting devices can be arranged according to the dimensioning of the ring. The ring can thus be moved separately from the wafer by means of the pin lifting devices. Such arrangements are also called ring lifters.

The pin lifting device can be part of a ring-lifter arrangement accordingly, where the substrate is a ring.

In one embodiment, the pin lifting device has a dynamic separating device for separating the process atmosphere region from an outer atmosphere region, wherein the drive unit is at least partially, in particular completely, assigned to the outer atmosphere region and the coupling is in particular at least partially assigned to the process atmosphere region. A defined internal volume can be varied by the separating device and the variation of the internal volume correlates with a movement of the sliding guide element.

In particular, the dynamic separating device can be coupled to the sliding guide element in such a way that when the coupling is adjusted from the lowered normal position to the extended support position, the internal volume decreases, in particular wherein a spatial extension of the separating device along the adjustment axis decreases.

The dynamic separating device may, in particular, take the form of a bellows located in the internal volume of the coupling part. The separating device of the pin lifting device may also be formed by a housing of the drive unit.

The drive unit can be designed as an electric motor, in particular a stepper motor, thus providing a mechatronic pin lifting device.

In one embodiment, the sliding guide element can have a central recess extending along the adjustment axis (in particular coaxial to the adjustment axis) and the recess can provide an internal thread. The pin lifting device can also have a threaded rod coupled to the drive unit with an external thread, wherein the external thread interacts with the internal thread.

According to one embodiment, the guide surface may be provided by a housing of the pin lifting device, in particular the coupling part, as an inner surface.

In a certain embodiment, the sliding element can be pretensioned by its interaction with the guide surface.

In particular, the sliding element can, by virtue of its geometrical shape and spatial dimensioning, provide an outer surface having the greatest distance (relative to the entire sliding guide element) with respect to the adjustment axis, the distance of which from the adjustment axis in a relaxed normal state is greater than a distance of the guide surface from the adjustment axis, whereby the sliding element is pretensioned in cooperation with the guide surface and provides a spring effect. The relaxed normal state corresponds in particular to a state in which the sliding guide element is not in the pin lifting device or not in the coupling part, but in particular separate.

In one embodiment, the sliding guide element can have at least one first sliding element at a first end with respect to a direction of extension of the sliding guide element and at least one second sliding element at a second end opposite the first end, wherein the at least first and the at least second sliding element cooperate with the guide surface in such a way that the sliding guide element is mounted in a tilt-free manner, wherein the sliding guide element is present in a tilt-free manner in each case within the scope of its mobility along the adjustment axis.

By designing the pin lifting device in this way, a homogeneous distribution of the clamping forces between sliding elements and guide surfaces can be achieved. This ensures optimum sliding of the sliding guide element in the coupling part. Furthermore, lubricants can be dispensed with by suitably FIG. 3 matching the clamping forces acting on the guide surface and the sliding properties that can thus be adjusted. A suitable choice of material or coating of the contact surfaces can also influence the sliding properties.

According to one embodiment, the sliding guide element can have a cylindrical shape, wherein the sliding guide element is shaped in a hollow-cylindrical manner at least at a first upper end and the hollow cylindrical wall has at least one second recess.

In particular, the at least one recess may be shaped such that the recess extends parallel to the cylinder axis.

In one embodiment, the sliding guide element may have at least two recesses extending in particular parallel to the cylinder axis, wherein the sliding element is provided by a hollow-cylinder section located between the two recesses. The recesses are present here in particular in different radial directions (with respect to the cylinder axis), wherein their axial positions at least overlap, in particular coincide.

The recess or recesses can be particularly formed in a slot-shaped manner, but alternative forms of recess are possible which preferably define the hollow-cylinder section.

In particular, the cylinder axis of the sliding guide element is aligned coaxially with the adjustment axis.

One embodiment of the invention thus relates to a sliding guide element of a pin lifting device, wherein the sliding guide element may be formed cylindrically with a circular base surface, and the sliding guide element is formed in a hollow-cylindrical manner at an upper and a lower section. The hollow-cylindrical sections each have at least four slots provided parallel to the cylinder axis, so that a corresponding number of interposed sliding elements is formed on each section.

Figure 2A:
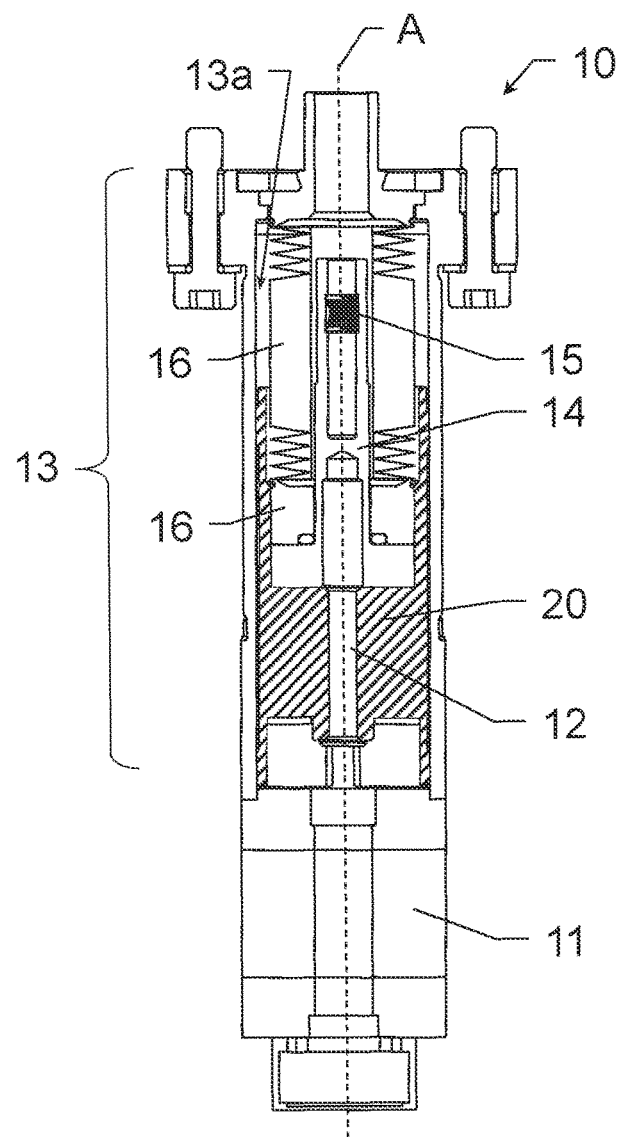
Figure 2B:
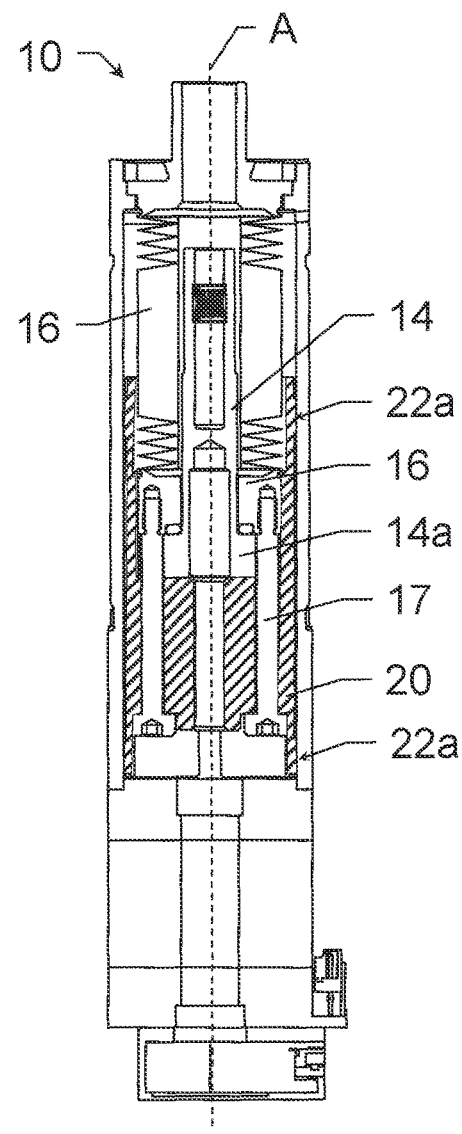

The devices according to the invention are described in more detail in the following by means of concrete embodiment examples shown schematically in the drawings by way of example only, wherein further advantages of the invention are also discussed. The drawings show in detail:

FIG. 1 shows a schematic representation of an embodiment of a vacuum processing apparatus for a wafer with a lifting device according to the invention;

FIGS. 2*a-b* show an embodiment of a pin lifting device of the invention; and

Figure 3:
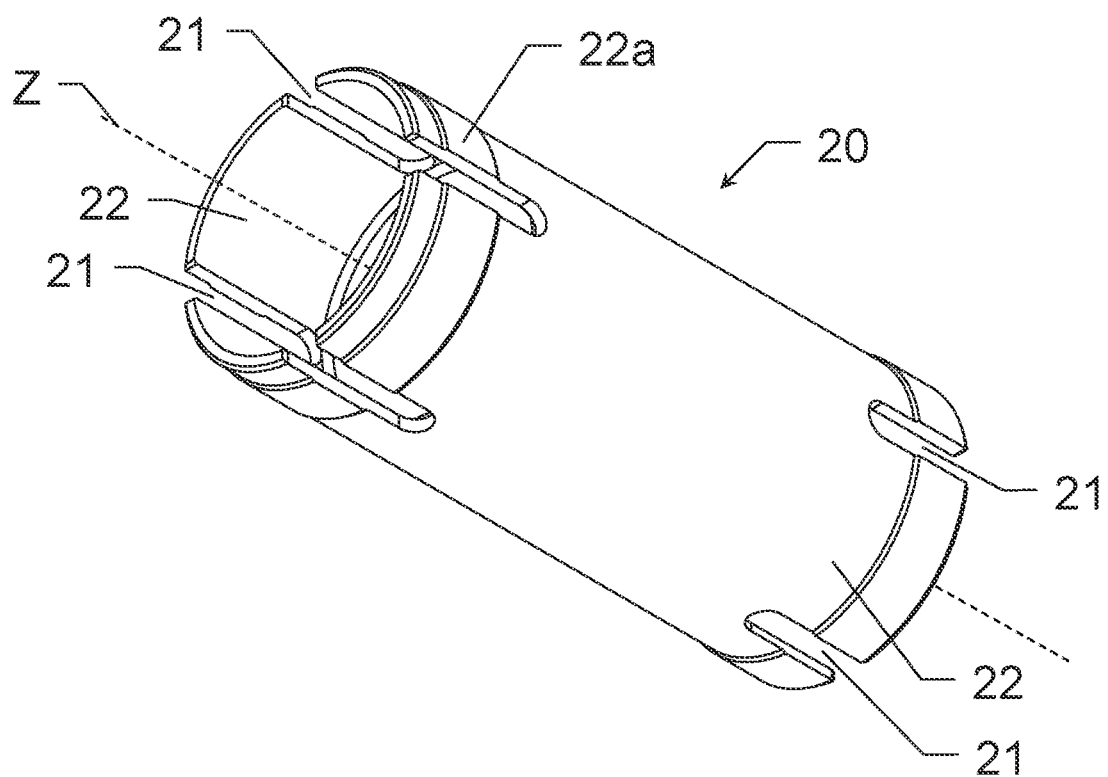

FIG. 3 shows an embodiment of a sliding guide element of a pin lifting device according to the invention.

FIG. 1 schematically shows a process setup for processing a semiconductor wafer 1 under vacuum conditions. The wafer 1 is placed in a vacuum chamber 4 (process atmosphere region P) by means of a first robot arm 2 through a first vacuum transfer valve 5*a* and brought into position by means of support pins 7 of pin lifting devices (here: three pins shown) according to the invention. The wafer 1 is then picked up or placed on the pins 7 and the robot arm 2 is moved away. The pins of the pin lifting devices are here in an extended support position. The wafer 1 is typically placed on the robot arm or on a support device provided on the robot arm 2,3 or is held by means of a specific support device. After wafer 1 is picked up by pins 7, the robot arm is guided out of chamber 4, transfer valve 5*a* is closed and pins 7 are lowered (to the normal position). This is carried out by means of the drives 6 of the pin lifting devices which are coupled to the respective pins 7. The wafer 1 is thus placed on the four support elements 8 shown.

In this state, a desired processing (e.g. coating) of wafer 7 takes place under vacuum conditions and especially in a defined atmosphere (i.e. with a certain process gas and under defined pressure). For this purpose, chamber 4 is coupled to a vacuum pump and preferably to a vacuum control valve to control the chamber pressure (not shown).

After processing, wafer 1 is lifted into a removal position (support position) again by means of the pin lifting devices. With the second robot arm 3, wafer 1 is subsequently removed by the second transfer valve 5*b*. Alternatively, the process can be designed with only one robot arm, in which case loading and unloading can be carried out by a single transfer valve.

FIGS. 2*a* and 2*b* show an embodiment of a pin lifting device 10 according to the invention in different sectional views. The pin lifting device 10 is shown in a lowered normal position.

FIG. 2*a* shows a drive unit 11 of the pin lifting device 10 designed as a motor (electric motor). The motor can be a servo or stepper motor, for example. The drive unit 11 is coupled to a shaft designed here as spindle 12, i.e. the shaft 12 can be rotated by means of the motor. The rotation can be carried out in a controlled manner, e.g. according to a given number of rotations, or it can be regulated. Controlled operation is possible, for example, in conjunction with an encoder, wherein the encoder provides a manipulated variable, for example with respect to the axial position of a bearing pin. In the example shown, spindle 12 has an external thread. The thread can be designed as trapezoidal, pointed or round thread. The threaded rod 12 (spindle) can thus be rotated by appropriate control of the motor 12.

The pin lifter 10 also features a sliding guide element 20 according to the invention. The sliding guide element 20 has a central recess extending axially in the direction of extension of the sliding guide element 20, in this case coaxially to the adjustment axis A. The recess provides an internal thread. The internal thread can, for example, be provided directly by sliding guide element 20, i.e. the internal thread can be cut into the material of sliding guide element 20. Alternatively, a sleeve with an internal thread can be provided in the recess, for example.

The sliding guide element 20 is coupled to the external thread of spindle 12 by means of its internal thread, i.e. external thread and internal thread correspond and interact. The external thread engages with the internal thread. The spindle 12 is directly coupled exclusively to the sliding guide element 20 as the moving element. In other words, the spindle provides a coupling of the drive 12 with the sliding guide element 20, in particular with only the sliding guide element 20.

This interaction allows the sliding guide element 20 to be moved back and forth in the direction of the extension of the adjustment axis A by turning spindle 12. The movement can thus be made axially along the adjustment axis A. For this purpose, the sliding guide element 20 can be mounted in such a way that the sliding guide element 20 is essentially unable to perform a rotational movement around the adjustment axis, but can only move axially.

The sliding guide element 20 is also connected to the coupling 14 of the pin lifting device 10. The coupling 14 can thus be moved axially in the same way as the sliding guide element 20, especially from the shown lowered normal position to an extended support position.

The coupling 14 has a receptacle 15 for receiving a support pin. Such a support pin is preferably designed for contacting and supporting a substrate (e.g. semiconductor wafer). The receptacle 15 comprises a ring or spiral spring which provides a clamping locking of the support pin in the coupling 14. However, the receptacle can also have an alternative locking device (e.g. collet, magnet, screw thread, etc.). The support pin can be inserted axially from above along axis A through an opening provided for this purpose in the pin lifting device 10, in particular in the receptacle 15 of coupling 14.

The sliding guide element 20 thus forms a connecting component by means of which the support pin can ultimately be moved by the drive.

An advantage of this solution is that the drive train, here in particular the shaft provided as spindle 12 and the coupling of the coupling 14 to the shaft, is present in a tilt-free manner due to the interposed sliding guide element 20 and remains precisely axially aligned by the sliding guide element 20 even during movement. In addition, the sliding guide element 20 enables the required process tolerances to be maintained with regard to the movement accuracy of the support pin, both axially (avoidance of stick-slip effects) and laterally. For this purpose, the sliding guide element 20 provides in particular a compensation of production-related device tolerances.

These advantages can be realized, for example, by an adapted dimensioning of the sliding guide element 20 and a corresponding choice of material. For example, an inner surface 13a of the pin lifting device 10, in particular of an upper coupling part 13, may form a sliding surface (guide surface) or sliding sleeve for the sliding guide element 20 and the sliding guide element 20 may at least partially contact this surface during a movement. The inner surface 13a can be provided in particular by a housing wall of the pin lifter 10.

By selecting the appropriate material, the movement of the sliding guide element 20 can be carried out with low friction and without lubricant. For example, PTFE or another non-stick material can be selected as the production material or surface coating. The sliding guide element 20 and/or the inner surface 13a can have this material.

The sliding guide element 20 can also be designed so that it functions as a spring element or has a spring element. A sliding element 22 designed in this way is shown in FIG. 3, for example. This ensures a constant coaxial alignment of the sliding guide element 20 in the coupling part 13.

In addition, pin lifter 10 has a bellows 16 designed as an atmospheric separating device. The bellows 16, the coupling 14 and the receptacle 15 are part of the upper coupling part 13.

Bellows 16 is connected at its upper end to the housing of pin lifter 10 either indirectly (e.g. by means of a top-mounted housing seal) or directly. At its lower end the bellows 16 is connected to the coupling 14. The connections are each formed in a gas-tight manner. The inner volume or axial extension of the bellows 16 can be varied, while maintaining an atmospheric separation, especially between the process atmosphere and the outside atmosphere.

FIG. 2b shows an embodiment of the connection of the sliding guide element 20 with the coupling 14. For this purpose, the sliding guide element 20 provides at least two parallel bores which are designed in particular parallel to the central recess and here also parallel to the adjustment axis A. A screw 17 is passed through each of the bores, which is screwed with its screw end to the bellows 16 and whose screw head rests at the bottom on the sliding guide element 20. A lower part 14a (base) of the coupling 14 is positioned between the bellows 16 and the sliding guide element 20, whereby the coupling 14 rests on the sliding guide element 20, in particular is pressed against it by the screw force provided.

The bellows 16 and the coupling 14 are connected in such a way that the coupling 14 provides a one-sided atmospheric seal for the bellows 16.

With such an arrangement, the coupling 14 together with the bellows 16 can be moved linearly within the pin lifting device 10 by driving the spindle 12.

As the threaded rod 12 is only coupled to the sliding guide element 20 and has no direct connection with the coupling 14 or the bellows 16, a galvanic/electrical isolation of the drive 11 from the upper coupling part 13 can be realized in a comparatively simple way by such a design. For this purpose, the sliding guide element 20 is made of a non-conductive material or coated with it. The housing can have a corresponding insulating separation. In this case, the drive 11 has no electrically conductive connection to the upper part of the pin lifting device 10 and thus no electrical connection to the process chamber in generic operation. The sliding guide element 20 according to the invention can thus provide in particular a galvanic separation between drive 11 and process chamber (especially the chuck in the process chamber). This can be advantageous for avoiding potential-related influences during machining in the process chamber. A potential difference can lead to faulty substrate processing.

FIG. 3 shows a sliding guide element 20 according to the invention in a perspective view. The sliding guide element 20 has a cylindrical shape with a round base.

The sliding guide element 20 has four recesses 21 in the form of slots at both axial ends. A respective sliding element 22 is formed between each two slots 21. Due to the selected shape, the sliding elements 22 have elasticity in the radial direction (orthogonal to the cylinder axis Z) and can provide a spring effect accordingly. In addition, each sliding element 22 has an outer surface section 22a, the outer radius of which is larger than the respective outer radius of the adjacent surfaces.

The dimensioning of the outer surface sections 22a is selected with respect to an inner radius or inner diameter of the coupling part of a pin lifting device in particular in such a way that the outer radius of an outer surface section 22a is defined larger than the inner radius and thus a defined tension of the sliding elements 22 is present in an inserted state. This causes a force in the direction of the inner wall of the coupling part. In the inserted state, the cylinder axis Z is in particular coaxial with the adjustment axis A.

Due to the symmetrical design of the sliding guide element 20, self-centering and/or deflection of the sliding guide element 20 can thus be provided.

Due to the axially relatively wide, in particular maximum, spaced arrangement of the surface sections 22a, a defined guidance of the sliding guide element 20 itself and/or a coupling or bellows coupled thereto can also be provided. The surface sections 22a, which are spaced apart from each other, also prevent the element 20 from tilting, thus ensuring precise guidance.

It is understood that the depicted figures only schematically represent possible embodiment examples. According to the invention, the different approaches can be combined with each other as well as with devices for substrate movement in vacuum process chambers, in particular pin lifters, of the state of the art.

The invention claimed is:

1. A pin lifting device configured to move and position a substrate, in a process atmosphere region which can be provided by a vacuum process chamber, comprising:

a coupling part which has a coupling formed to receive a support pin designed to contact and support the substrate, and a drive unit, which is designed and interacts with the coupling in such a way that the coupling is linearly adjustable along an adjustment axis from a lowered normal position for providing a support pin received by the coupling in a state substantially free of effect with respect to its intended effect, into an extended support position for providing the intended effect of receiving and/or providing the substrate by the support pin, and back again, wherein the coupling part has a sliding guide element movable along the adjustment axis, wherein the sliding guide element is coupled to the drive unit and to the coupling and provides the interaction of the drive unit with the coupling, and the sliding guide element has at least one sliding element, wherein the sliding element interacts with a guide surface provided by the coupling part in such a way that the sliding guide element can be guided linearly along the adjustment axis and in a sliding manner relative to the guide surface, wherein the sliding guide element has at least one first sliding element at a first end with respect to an extension direction of the sliding guide element and at least one second sliding element at a second end opposite the first end, wherein the at least first and the at least second sliding element cooperate with the guide surface in such a way that the sliding guide element is mounted in a tilt-free manner, and wherein the sliding guide element is present in a tilt-free manner in each case within the scope of its mobility along the adjustment axis.

2. The pin lifting device according to claim 1, wherein the sliding guide element has a central first recess extending along the adjustment axis and the first recess provides an internal thread, and the pin lifting device has a threaded rod coupled to the drive unit with an external thread and the external thread interacts with the internal thread.

3. The pin lifting device according to claim 1, wherein the guide surface is provided by a housing of the pin lifting device or a housing of the coupling part.

4. The pin lifting device according to one of claim 1, wherein the sliding element is present in a pretensioned manner by the interaction of the sliding element with the guide surface.

5. The pin lifting device according to claim 4, wherein the sliding element defines by its geometrical shape an outer surface having the greatest distance with respect to the adjustment axis, the distance of which from the adjustment axis in a relaxed normal state is greater than a distance of the guide surface from the adjustment axis, whereby the sliding element in cooperation with the guide surface provides a spring effect.

6. The pin lifting device according to claim 1, wherein the sliding guide element has a cylindrical shape, wherein the sliding guide element is formed in a hollow-cylindrical manner at least at a first end and the hollow-cylindrical wall has at least one second recess.

7. The pin lifting device according to claim 6, wherein the sliding guide element has at least two recesses, wherein the sliding element is provided by a hollow-cylindrical section located between the two recesses.

8. The pin lifting device according to claim 6, wherein the at least one second recess or the two recesses is or are formed in such a way that the second recess or the two recesses extends or extend parallel to the cylinder axis.

9. The pin lifting device according to claim 1, wherein a cylinder axis of the sliding guide element is coaxial to the adjustment axis.

10. The lifting device according to claim 1, wherein the pin lifting device has a dynamic separating device for separating the process atmosphere region from an external atmosphere region, wherein the drive unit is at least partially assigned to the outer atmosphere region and the coupling is assigned to the process atmosphere region, and an internal volume defined by the separating device can be varied and the variation of the internal volume correlates with a movement of the sliding guide element.

11. The pin lifting device according to claim 10, wherein the dynamic separating device is coupled to the sliding guide element in such a way that the internal volume decreases when the coupling is moved from the lowered normal position to the extended support position.

12. The pin lifting device according to claim 10, wherein the dynamic separating device is designed as a bellows in the coupling part.

13. The pin lifting device according to claim 1, wherein the pin lifting device is part of a ring-lifter arrangement and the substrate is a ring.

* * * * *